United States Patent

Noguchi et al.

[11] Patent Number: 5,172,339
[45] Date of Patent: Dec. 15, 1992

[54] SEMICONDUCTOR MEMORY DEVICE HAVING ERROR CHECKING AND CORRECTING CIRCUIT AND OPERATING METHOD THEREFOR

[75] Inventors: Kenji Noguchi; Shinichi Kobayashi; Makoto Yamamoto; Tsuyoshi Toyama, all of Hyogo, Japan

[73] Assignee: Mitsubishi Denki Kabushiki Kaisha, Tokyo, Japan

[21] Appl. No.: 570,468

[22] Filed: Aug. 21, 1990

[30] Foreign Application Priority Data

Aug. 29, 1989 [JP] Japan .................. 1-222206
Jun. 27, 1990 [JP] Japan .................. 2-168873

[51] Int. Cl.[5] .................. G06F 11/10; G11C 29/00
[52] U.S. Cl. .................. 365/201; 365/200; 365/63; 371/21.3; 371/40.1
[58] Field of Search .......... 365/200, 201, 63; 371/21.3, 21.4, 40.1, 40.4, 51.1; 364/571.01, 571.02, 571.03, 571.07

[56] References Cited

U.S. PATENT DOCUMENTS

| | | | |
|---|---|---|---|
| 4,692,900 | 9/1987 | Ooami et al. | 365/63 |
| 4,805,151 | 2/1989 | Terada et al. | 371/21.1 |
| 4,811,294 | 3/1989 | Kobayashi et al. | 365/189.05 |
| 4,866,676 | 9/1989 | Crisp et al. | 365/200 |
| 4,958,352 | 9/1990 | Noguchi et al. | 371/40.1 |
| 5,012,472 | 4/1991 | Arimoto et al. | 371/40.1 |

FOREIGN PATENT DOCUMENTS 3833713 10/1988 Fed. Rep. of Germany.

OTHER PUBLICATIONS

Davis, "A 70-ns Word-Wide 1-Mbit ROM With On-Chip Error-Correction Circuits", *IEEE Journal of Solid-State Circuits*, vol. SC-20, No. 5, Oct. 1985, pp. 958-963.

Hölscher et al., "Mikrocomputer in der Sicherheitstechnik", Sep., 1984.

*Primary Examiner*—Joseph A. Popek
*Assistant Examiner*—Jack A. Lane
*Attorney, Agent, or Firm*—Lowe, Price, LeBlanc & Becker

[57] ABSTRACT

A semiconductor memory device having an error checking and correcting (ECC) circuit is disclosed. This memory device includes data lines (10-21) from an ECC data generation circuit and bit lines (30-41) connected to the adjacent memory cells in a memory array (1), which are selectively connected at specified connecting portions (51, 52). When predetermined test data is inputted in order to detect undesired contact or interference between the memory cells, checker pattern data can be written in all the memory cells. Thus, despite the fact that the memory device includes an ECC circuit, a complete and easy memory cell checking is carried out.

12 Claims, 10 Drawing Sheets

SEMICONDUCTOR MEMORY DEVICE HAVING ERROR CHECKING AND CORRECTING CIRCUIT AND OPERATING METHOD THEREFOR

BACKGROUND OF THE INVENTION

1. Field of the Invention

The present invention relates generally to semiconductor memory devices having error checking and correcting circuits (ECC) and, more particularly, to testing memory devices including ECC in which complete checker pattern data are written into the memory cells to be tested. The present invention has particular applicability to an electrically erasable programmable read only memory.

2. Description of the Background Art

Recently, the storage capacity of a semiconductor memory is substantially increased due to a higher degree of integration thereof. Defects in memory cells are more liable to occur with a higher degree of integration of the memory. Two methods have been known as countermeasures for the defects occurring in the memory cells; that is, the one is by employing a redundancy circuit, and the other is by employing an error checking and correcting (hereinafter referred to as "ECC") circuit. In the redundancy circuit method, spare memory cell rows or columns are provided in advance in a semiconductor memory to be electrically exchanged for memory cell rows or columns where defective memory cells exist. More specifically, the defective memory cell rows or columns are replaced by the spare memory cell rows or columns. In the ECC circuit method, errors which occur in data signals read out of the memory cells are checked. When the errors exist, error data thereof is automatically corrected. A brief description will be given on the ECC.

The ECC is provided to achieve high reliability of stored data in the semiconductor memory such as an electrically erasable programmable read only memory (hereinafter referred to as "EEPROM"). The EEPROM to which the ECC is employed comprises a memory cell for ECC as well as a memory cell for data storage. As an example of the ECC, a single bit error correction (hereinafter referred to as "SEC") is known. In a case where erroneous bits exist in data bits and ECC bits both having a predetermined data length, the SEC circuit is provided to detect and correct the erroneous bits. A description as to the ECC circuit is given in, for example, a paper entitled "A 70-ns Word-Wide 1-Mbit ROM With On-Chip Error-Correction Circuits" (IEEE JOURNAL OF SOLID-STATE CIRCUITS, VOL SC-20, NO. 5, OCTOBER 1985). In addition to this SEC, an ECC circuit is also known which can detect and correct erroneous bits of 2 or 3 bits in order to obtain data signals having higher reliability.

In the case of single bit error correction (SEC), for example, where a bit length of a data word is represented by m, and that of an ECC word is represented by k, the m and k are required to satisfy the following inequality.

$$2^k - 1 \geq m + k$$

A comparison of the data bit length m and the ECC bit length k to be integer values, based on the above inequality, is shown in Table 1.

TABLE 1

| Data bit length (m) | 4 | 8 | 16 | 32 | 64 |
| --- | --- | --- | --- | --- | --- |
| ECC bit length (k) | 3 | 4 | 5 | 6 | 7 |

FIG. 4A is a circuit block diagram of a conventional EEPROM. A description as to the EEPROM shown in FIG. 4A is disclosed in, for example, U.S. Pat. No. 4,811,294. In addition to this, a description as to a more detailed circuit of the memory cell is disclosed in, for example, U.S. Pat. No. 4,805,151. Referring to FIG. 4A, this EEPROM comprises a memory array 1 formed of a memory array 1a for storing data and a memory array 1b for storing ECC data, a Y gate circuit 6 for selecting a bit line BL, a sense amplifier 8 for amplifying data signals stored in the memory arrays 1a and 1b, a generation circuit 9 for generating ECC data in response to input data supplied via an input/output buffer 107, and an ECC circuit 7 for checking and correcting data stored in the memory array 1a based on data stored in the memory array 1b. The X decoder 3 selects a word line WL in response to X address signals $X_O$–$X_n$ applied via an X address buffer 2. A Y decoder 5 controls the Y gate circuit 6 in response to Y address signals $Y_O$–$Y_m$ applied via a Y address buffer 4. The Y gate circuit 6 selects a bit line BL.

A read/write control circuit 114, an erase/program control circuit 115, and a read control circuit 117 are provided to control this EEPROM. These control circuits 114, 115 and 117 control data reading/writing/outputting and the operation of the EEPROM in response to a chip enable signal $\overline{CE}$, an output enable signal $\overline{OE}$, a write enable signal $\overline{WE}$ and the like, which are externally applied to a control signal buffer 113.

A column latch/high voltage switch circuit 118 and a word line high voltage switch circuit 119 are provided at the periphery of the memory arrays 1a and 1b. The column latch/high voltage switch circuit 118 latches data D0–D7 to be stored in the memory cell array 1a and ECC data P1–P4 to be stored in the memory array 1b. A higher voltage developed in accordance with the latched data is applied to the bit line in programming operation and to a control gate line in erasing operation. The word line high voltage switch circuit 119 applies a high voltage to the word line in either the programming operation or the erasing operation.

One memory cell 101 comprises a selecting transistor 102 and a storing transistor 103. The transistor 103 comprises a floating gate 105 for storing data. The transistor 102 has its source connected to the bit line BL and its gate connected to the word line WL. The transistor 103 has a control gate connected to the control gate line CGL. The memory arrays 1a and 1b are both formed of a large number of memory cells 101.

In data writing, input data D0–D7 are externally supplied to the input/output buffer 107 and the data D0–D7 are supplied to the column latch/high voltage switch circuit 118 via the Y gate circuit 6. The data latched in the column latch/high voltage switch circuit 118 are stored as the data D0–D7 in the memory array 1a. Meanwhile, the ECC data generation circuit 9, to be described later with reference to FIG. 6, generates the ECC data P1–P4 in response to the input data D0–D7. The data P1–P4 are supplied to the column latch/high voltage switch circuit 118 via the Y gate circuit 6, and the latched data are stored as the ECC data P1–P4 in the memory array 1b.

In data reading, the data stored in the respective memory arrays 1a and 1b are supplied via the Y gate circuit 6 to the sense amplifier 8. The data D0-D7 and ECC data P1-P4 amplified by the sense amplifier 8 are supplied to the ECC/circuit 7 to be subject to error checking and correcting processing therein. The processed data is outputted externally via the input/output buffer 107.

As can be understood in the above description, it should be noted that the ECC data P1-P4 ar internally generated and processed in the EEPROM. Therefore, it can be mentioned that one byte of data is formed of data bits D0-D7 and ECC bits P1-P4. A one byte data configuration is shown in FIG. 4B.

FIG. 5 is a sectional view showing a sectional structure of a memory cell for EEPROM provided on a semiconductor substrate. Referring to FIG. 5, the memory cell 101 comprises the transistor 103 for storing -data and the selecting transistor 102. The transistor 103 comprises the floating gate 105, a control gate 106, and source and drain regions 108 and 104 formed in a p type silicon substrate 111. The transistor 102 comprises a gate 110, and source and drain regions 104 and 109 formed in the substrate 111. The gates 105, 106 and 110 are isolated from one another by an insulating layer (not shown) formed on the substrate 111.

Data writing is carried out by storing a positive or negative charge in the floating gate 105. That is, the storing of the charge causes a change of a threshold voltage of the transistor 103 and thus storing of data "0" or "1". Since a portion of the insulating layer, sandwiched between the n+region 104 and the floating gate 105, is formed of a very thin oxide film, electrons can be stored or discharged in the floating gate 105 through this oxide film portion by employing a tunnel effect.

In erasing operation, electrons are injected into the floating gate 105 so as to increase the threshold voltage of the transistor 103. This operation, corresponding to storage of the data "1", brings the bit line BL to a ground potential, and application of a higher voltage to the word line WL and the control gate line CGL enables data erasing. In programming operation, electrons are extracted from the floating gate 105 so as to decrease the threshold voltage of the transistor 103. This operation, corresponding to storage of the data "0", holds the control gate line CGL at the ground potential, and is carried out by application of a higher voltage to the word line WL and to the bit line BL.

FIG. 6 is a circuit diagram showing an example of the ECC data generation circuit 9 shown in FIG. 4A. Referring to FIG. 6, the ECC data generation circuit 9 comprises EXOR gates 91 to 94 connected to selectively receive the input data D0 to D7. The EXOR gates 91 to 94 output the respective ECC data P1 to P4 in response to the input data D0 to D7. When data (0, 1, 0, 1, 0, 1, 0, 1) are supplied as the input data D0 to D7, for example, data (0, 1, 1, 1) are obtained as the ECC data P1 to P4. The ECC data P1 to P4 are stored in desired memory cells provided in the memory arrays 1a and 1b with the input data D0 to D7, as described above.

An EXOR gate having a plurality of inputs generates output signals indicating logic "1" when supplied with an odd number of input signals exhibiting only one of logics "1" and "0", while it generates output signals exhibiting logic "0" when supplied with an even number of input signals exhibiting only one of logics "1" and "0".

FIG. 7 is a circuit diagram of an example of the ECC circuit 7 shown in FIG. 4A. Referring to FIG. 7, the ECC circuit 7 comprises EXOR gates 121-124 connected to selectively receive data D0'-D7' and P1'-P4' read from the memory arrays 1a and 1b, inverters 131-134 for inverting output signals of the EXOR gates 121-124, AND gates 141-148 connected to selectively receive output signals of the EXOR gates 121-124 and of the inverters 131-134, and EXOR gates 151-158 connected to sequentially receive output signals of the read data D0'-D7' and of the AND gates 141-148. Error-corrected data D0-D7 are obtained via the EXOR gates 151-158.

An operation of the ECC circuit 7 shown in FIG. 7 will now be described in each of the cases that a defect occurs/does not occur in one of the memory cells storing the data D0'-D7' and P1'-P4'. First of all, in the case of no defect occurring in the memory cell, the read data D0'-D7' and P1'-P4', which are the same as the written data D0-D7 and P1-P4, are outputted from the memory arrays 1a and 1b. The EXOR gates 121-124, corresponding to the respective EXOR gates 91-94 in the ECC data generation circuit 9 shown in FIG. 6, are connected to selectively receive the data D0'-D7'. The EXOR gate 91 shown in FIG. 6 is, for example, connected to receive the data D0-D3, while the EXOR gate 121 shown in FIG. 7 is connected to receive the data D0'-D3'.

In addition, the EXOR gate 121 is connected to receive the read data P1' corresponding to the ECC data P1 outputted from the EXOR gate 91. Therefore, the EXOR gate 121 is supplied with an even number of data "1" in the case of no defect existing in the memory cell. The other EXOR gates 122-124 are connected in the same manner as the EXOR gate 121. Therefore, the EXOR gates 121-124 output output signals M1-M4 of a low level in response to an even number of the same data "1". As a result, the inverters 131-134 output signals $\overline{M1}$-$\overline{M4}$ of a high level. The AND gates 141-148 output signals of the low level in response to these signals M1-M4 and $\overline{M1}$-$\overline{M4}$. Accordingly, the EXOR gates 151-158 output the read data D0'-D7' as the correct data D0-D7 without being inverted.

The next description will be given on the operation in the case that a defect exists in one of the memory cells storing the read data D0'-D7' and P1'-P4'. Such case will be described as an example that the data "0" is read out as the data D3, which is to be "1" correctly. In this case, the EXOR gate 121 is supplied with data (0, 1, 0, 0, 0) as the input data, while the EXOR gate 124 is supplied with data (1, 0, 0, 1, 1) as the input data. Therefore, the EXOR gates 121 and 124 output the signals M1 and M4 of the high level. Meanwhile, the EXOR gates 122 and 123 output the signals M2 and M3 of the low level because they are not supplied with the data D3'. Therefore, only the AND gate 144 outputs a signal of the high level in response to supplied input data (1, 1, 1, 1), while the other AND gates 141-143 and 145-148 all output signals of the low level. The EXOR gate 154 has one input receive a high level signal outputted from the EXOR gate 144. Thus, the EXOR gate 154 outputs data inverted from the read data D3' as the data D3. Since the other EXOR gates 151-153 and 155-158 each have one input supplied with a signal of the low level, these gates output read data D0'-D2, and D4'-D7' as they are without being inverted.

As has been described, even if the data, inverted due to the defect in the memory cell, is read out, the performance of the ECC circuit 7 shown in FIG. 7 allows an error to be checked and corrected and thus enables the correct data to be outputted.

A description will be given on the necessity of confirmation of writing and reading of alternating bit testing pattern data in a preshipment test to be carried out before the semiconductor memory is put on the market. This alternating bit testing pattern is often called "checker pattern". An example of the checker pattern data is shown in FIG. 9A. In the EEPROM, for example, defects in the memory cells are caused by a short circuit of the floating gate. In the EEPROM, memory cells of one byte, adjacent to one another, are provided on the semiconductor substrate. A defect caused by the short of the floating gates each included in two adjacent memory cells is called a floating short. If such a defect occurs, data written in one of the memory cells is also written in the other. In order to detect the presence of such a defect, data writing/reading need be confirmed by writing data having opposite signal levels in the adjacent memory cells and by reading out the written data. Therefore, data (0, 1, 0, 1, 0, 1) are provided as checker pattern data D0-D7 in the test of the EEPROM shown in FIG. 4A.

FIG. 8A is a circuit diagram showing connection between conventional bit lines 30-41 and data lines 10-21 of an EEPROM. The EEPROM includes in general two or more memory array sections. For example, an EEPROM having a 64Kbit- storage capacitance includes 32 memory array sections. A description will be given, for simplification, on circuits associated with two memory array sections 201 and 202 provided in the EEPROM. Referring to FIG. 8A, the bit lines 30-41 connected to the memory array 201 are connected respectively to the data lines 10-21 via a Y gate circuit 6a. Each of transistors constituting the Y gates circuit 6a has its gate connected to receive an output signal Y1 from the Y decoder. Data D0-D7 and P1-P4 are written in the memory array 201 via the respective bit lines 30-41 and then are read out of the memory array 201. Another circuit handling another word which is, connected to a Y gate circuit 6b and is also shown in FIG. 8A, is connected in the same manner as the Y gate circuit 6a. The data lines 10-21 are connected to the ECC data generation circuit 9 shown in FIG. 6. Therefore, the data lines 10-17 are supplied with the data D0-D7 to be written, while the data lines 18-21 are supplied with the ECC data P1-P4 to be written.

An interconnection diagram (a plan view) for the interconnection shown in FIG. 8A is shown in FIG. 8B. FIG. 8B shows the connections of the memory array section 201 and sense amplifier 8 to interconnections 10-21. The data D0-D7 and P1-P4 are transmitted via the respective interconnections 10-21. Interconnections M0-M11 are connected between the memory array section 201 and the interconnections 10-21. The interconnections 10-21 are connected through holes TH to the interconnections M0-M11, respectively. Interconnections S0-S11 are connected between the sense amplifier 8 and the interconnections 10-21. The interconnections 10-21 are connected through holes to the interconnections S0-S11, respectively.

Since the bit lines 30-41 and the data lines 10-21 are sequentially connected via the Y gate circuit 6a in the conventional circuit connection, as described above, the following inconvenience occurs that a test employing the checker pattern data cannot be stored in all cells of each byte. Storage of the alternating bit testing pattern is necessary for identifying coupling between cells or shorts between signal lines. Such a coupling or shorting becomes apparent when the alternating bit testing pattern stored in the memory cells in the test is read out.

In the case that the above data D0-D7 are supplied as the checker pattern data, for example, data (0, 1, 1, 1) is outputted as the ECC data P1-P4 from the ECC data generation circuit 9 shown in FIG. 6. That is, although the bit pattern shown in FIG. 9A, for example, should be employed as the checker pattern data, the bit pattern shown in FIG. 9B is obtained in practice. This means that data of opposite signal levels cannot be written in the adjacent memory cells storing the ECC data P2-P4. Thus, there is a problem that the data of the opposite signal levels cannot be written in all the adjacent memory cells even by employing the checker pattern data, and hence the complete test cannot be carried out. In this case, an additional writing cycle is required to write the checker pattern data in the remaining memory cells for storing the ECC data. Therefore, additional operations are required and a testing procedure becomes complicated.

SUMMARY OF THE INVENTION

It is an object of the present invention to determine whether or not undesired short circuit or interference exists between any adjacent memory cells in a semiconductor memory device having error checking and correcting functions.

It is another object of the present invention to store a predetermined pattern of testing data into memory cells in the semiconductor memory device having error checking and correcting functions.

It is a further object of the present invention to easily detect the presence or absence of undesired short circuit or interference between any adjacent memory cells in the semiconductor memory device having error checking and correcting functions.

It is a still further object of the present invention to facilitate a necessary procedure to detect the presence or absence of undesired short circuit or interference between any adjacent memory cells in the semiconductor memory device having error checking and correcting functions.

It is a still further object of the present invention to write data signals having alternating voltage levels in the adjacent memory cells in the semiconductor memory device having error checking and correcting functions.

It is still another object of the present invention to write checker pattern data, in one write cycle, in memory cells for data to be stored and in memory cells for error correction in the semiconductor memory device having error checking and correcting functions.

It is a still further object of the present invention to write data signals having alternating voltage levels, in one write cycle, in the memory cells for data to be stored and in the memory cells for error correction in the semiconductor memory device having error checking and correcting functions.

Briefly, the semiconductor memory device according to the present invention comprises a first set of memory cells for storing data to be stored, and a second set of memory cells for storing error correction data. The first and second sets of memory cells are sequentially provided on a semiconductor substrate in a predetermined direction. This semiconductor memory device further comprises test data generating circuitry for generating predetermined test data, correction data generating circuitry responsive to test data for generating error correction data, regularly connecting circuitry for regularly connecting between the first set of memory cells and the test data generating circuitry and between the second set of memory cells and the correction data generating circuitry, and connection altering circuitry for altering connection by the regularly connecting circuitry so that data signals having alternating levels are stored in the first and second sets of memory cells.

In operation, since the data signals having alternating levels are stored in the first and second sets of memory cells, checker pattern data can be written into the memory cells in one writing cycle.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 8A:
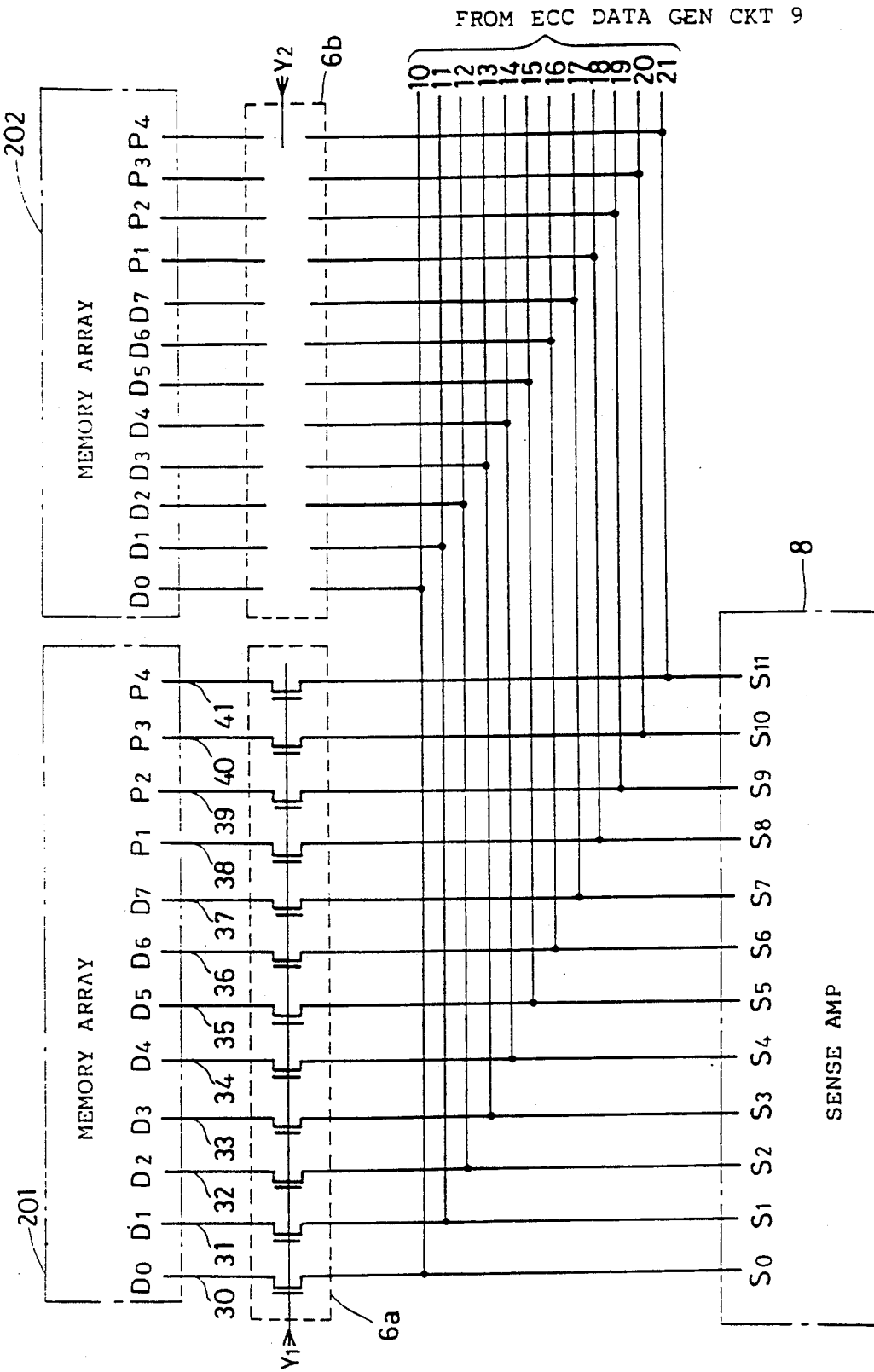
FIG. 8A is a circuit diagram of connection between conventional bit lines and data lines.
Figure 8B:
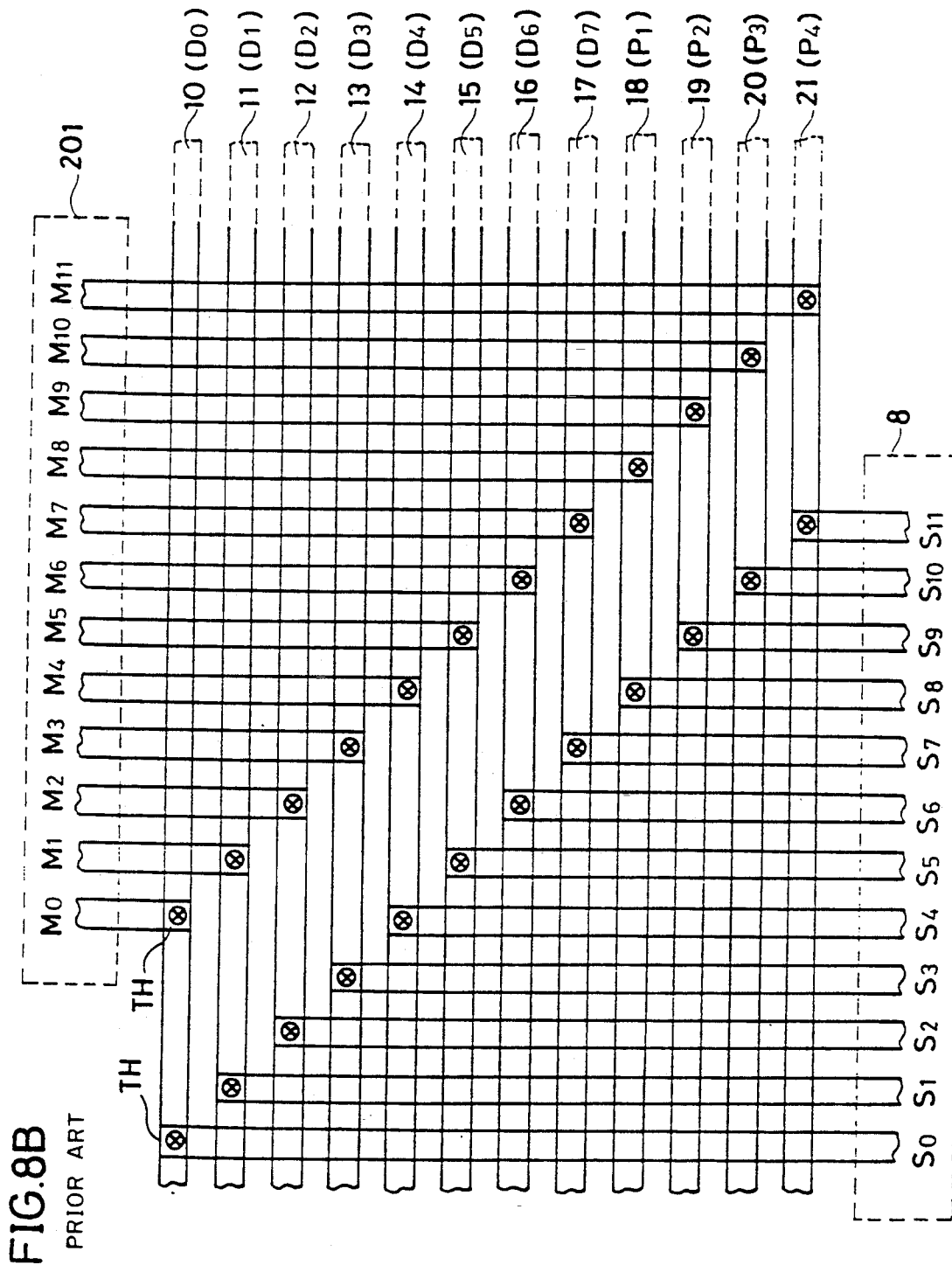
FIG. 8B is an interconnection diagram showing the interconnection shown in FIG. 8A.

Referring to FIG. 1, what is different from the circuit connection shown in FIG. 8 is connecting portions 51 and 52 enclosed by broken lines. That is, the bit lines 32 and 33 are connected respectively to the data lines 13 and 12 in the connecting portions 51. In addition, the bit lines 34 and 35 are respectively connected to the data lines 15 and 14 in the connecting portions 52. Such variation of interconnection enables adjacent memory cells provided in the memory array 1 to store data in the sequence of D0, D1, D3, D2, D5, D4, D6, D7, P1, P2, P3, P4.

Furthermore, predetermined test data shown in the following equality is supplied in order to write checker pattern data.

$$(D0, D1, ...D7) = (0, 1, 1, 0, 1, 0, 0, 1) \tag{1}$$

Figure 6:
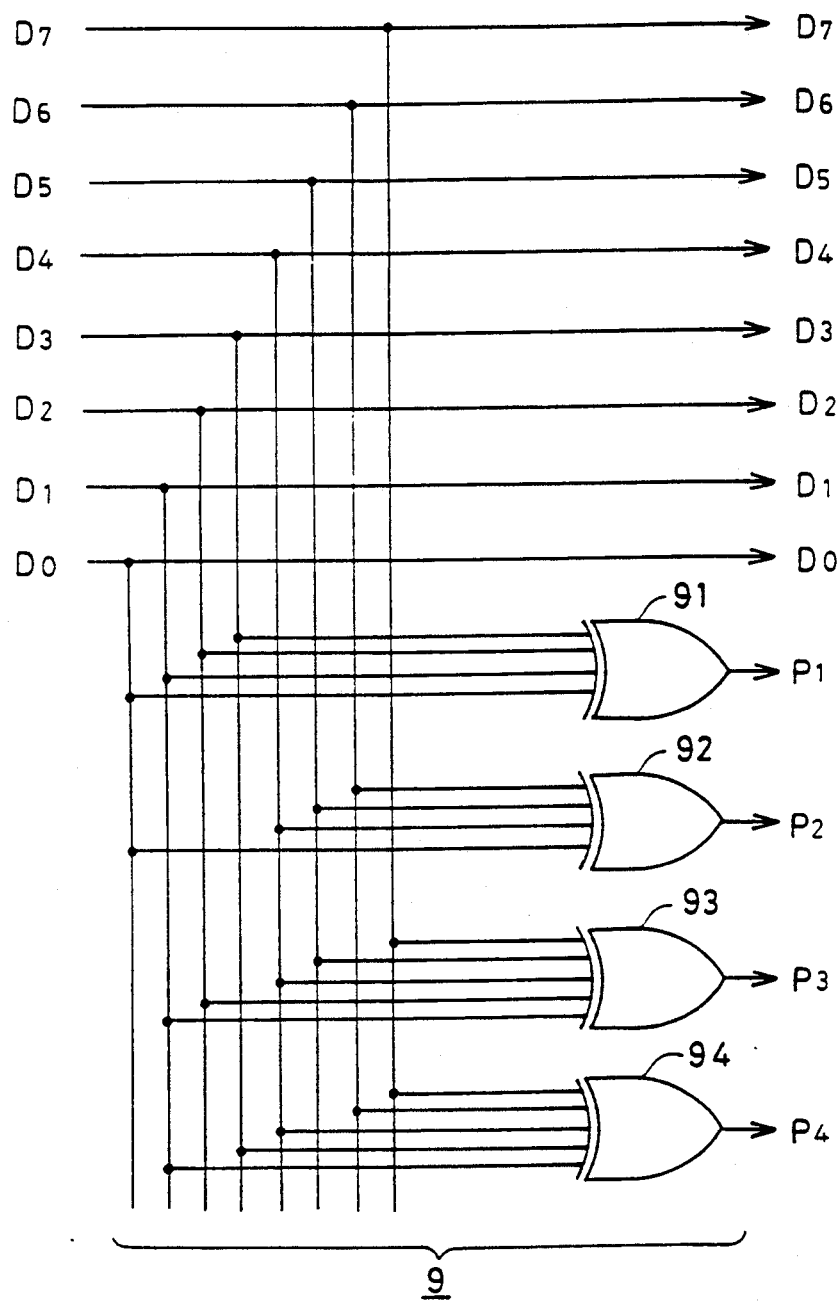
FIG. 6 is a circuit diagram of an example of an ECC data generation circuit shown in FIG. 4.
Figure 7:
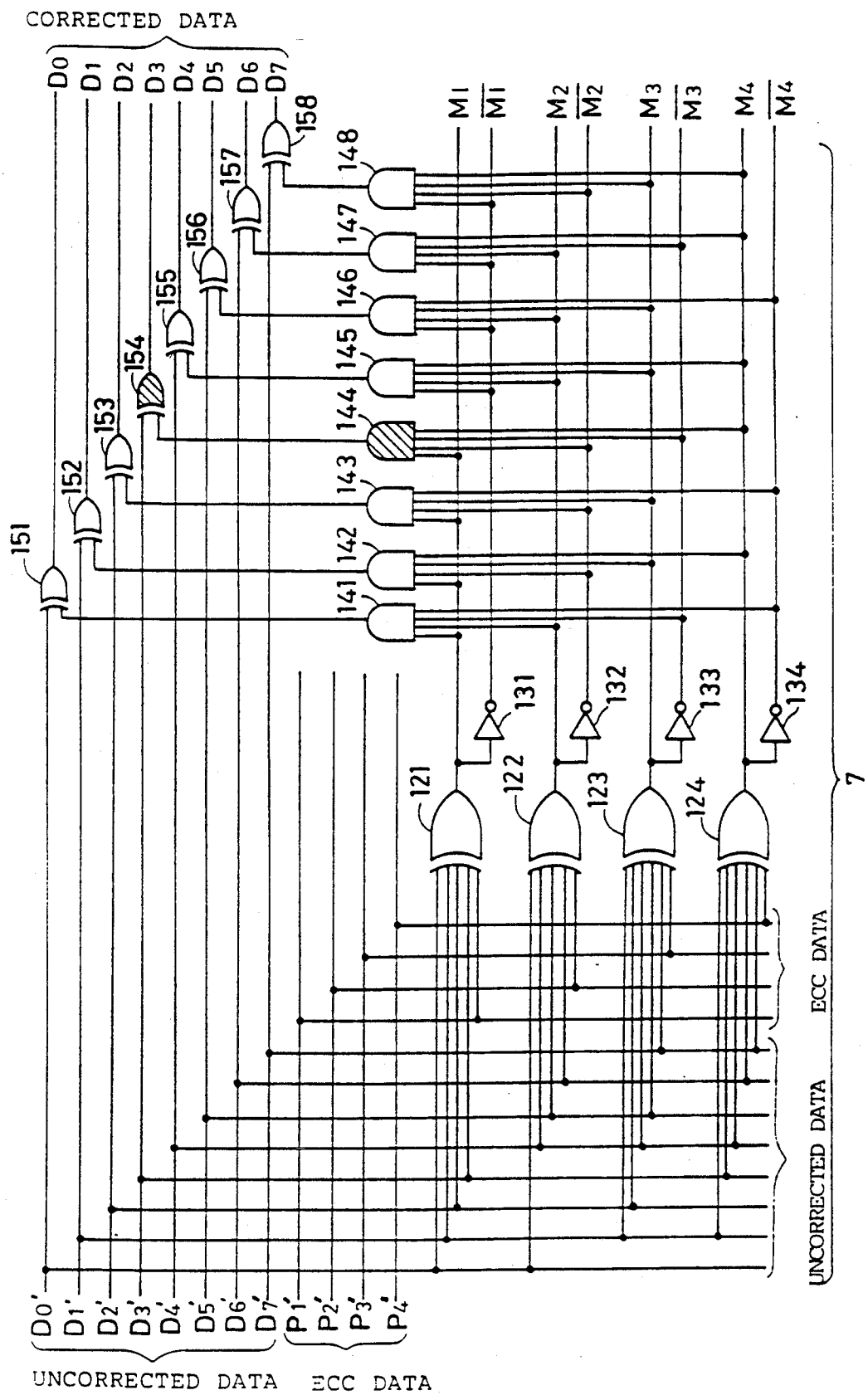
FIG. 7 is a circuit diagram of an example of an ECC circuit shown in FIG. 4.

Since the test data D0–D7 expressed in the above equality (1) is also supplied to the ECC data generation circuit 9 shown in FIG. 6, ECC data shown in the following equality is obtained.

$$(P1, P2, P3, P4) = (0, 1, 0, 1) \tag{2}$$

The data expressed in the equalities (1) and (2) are supplied to the bit lines 30–41 via the data lines 10–21 shown in FIG. 1. As a result, data (0, 1, 0, ...0, 1) are written in the adjacent memory cells. That is, alternating signal levels can be written in adjacent memory cells of both data and ECC data portions.

Figure 1A:
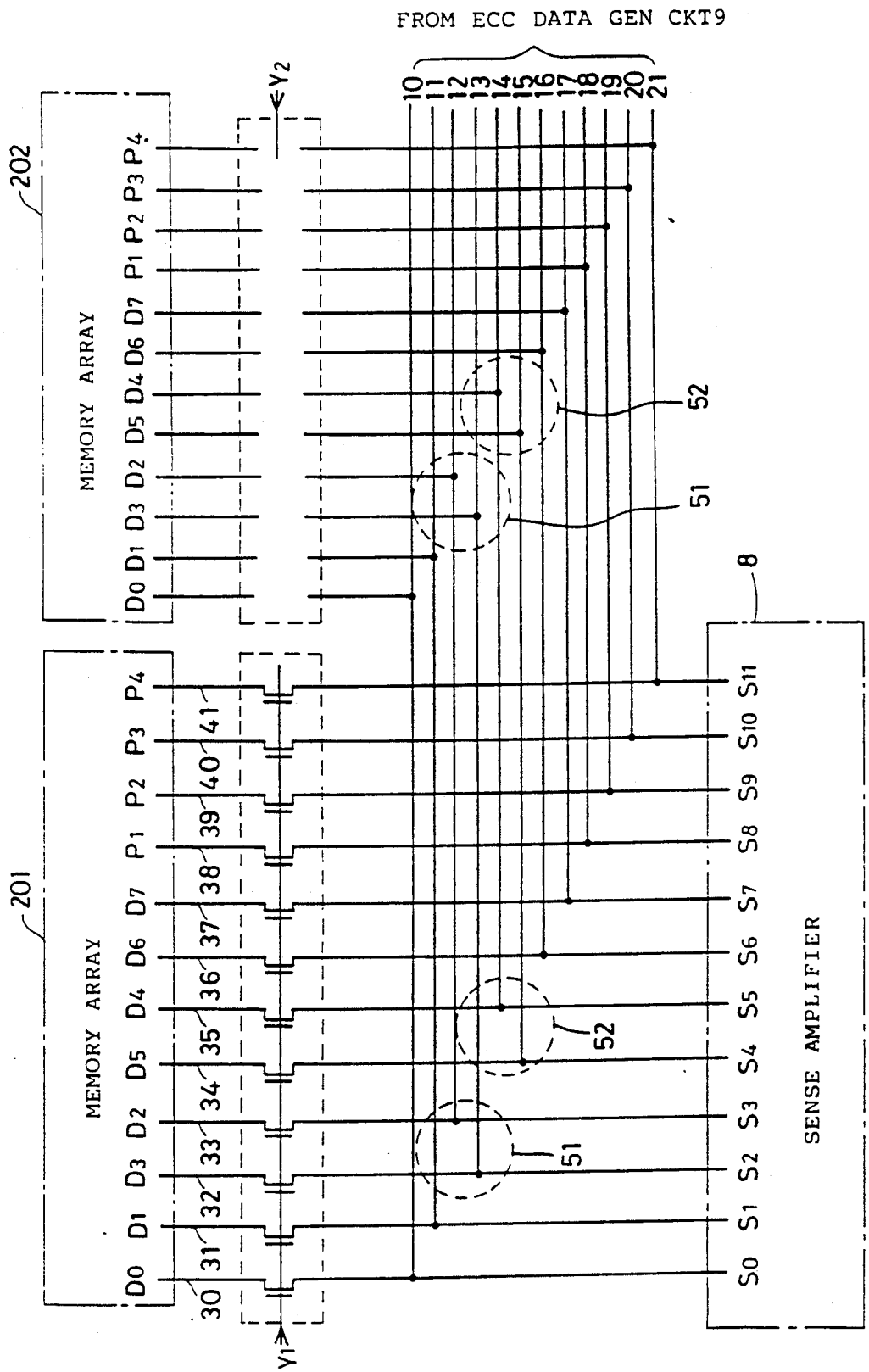
FIG. 1A a circuit diagram of connection between bit lines and data lines according to one embodiment of the present invention.
Figure 1B:
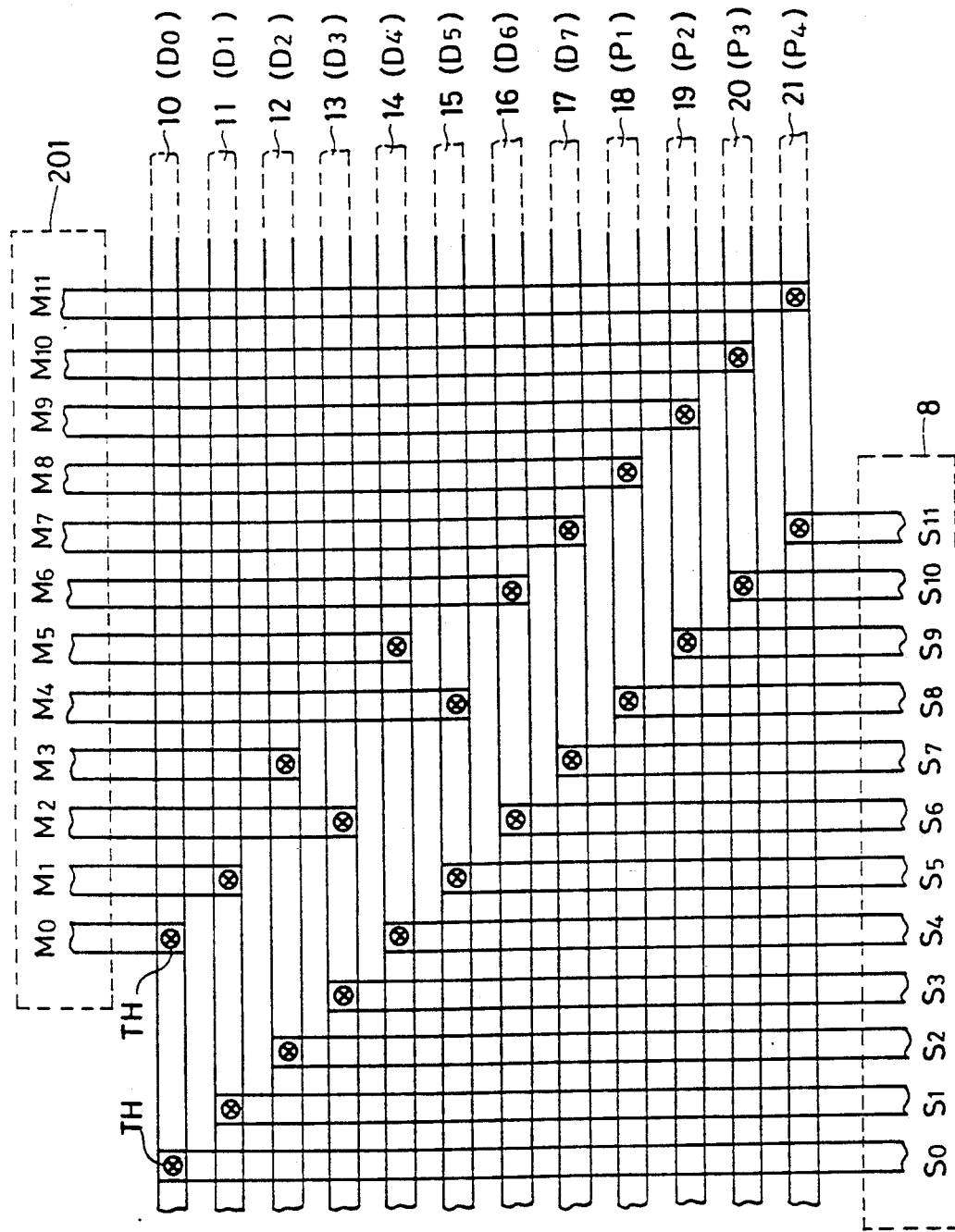
FIG. 1B is an interconnection diagram showing an interconnection for implementing an equivalent circuit shown in FIG. 1A.

FIG. 1B shows an interconnection diagram for the interconnection shown in FIG. 1A. In comparison with the conventional interconnection shown in FIG. 8B, an interconnection M2 from a memory array section 201 is connected to an interconnection 13, while an interconnection M3 is connected to an interconnection 12. Further, interconnections M4 and M5 are connected to interconnections 15 and 14, respectively. The other interconnections are the same as those shown in FIG. 8B. Therefore, the equivalent circuit shown in FIG. 1A is implemented.

Figure 2:
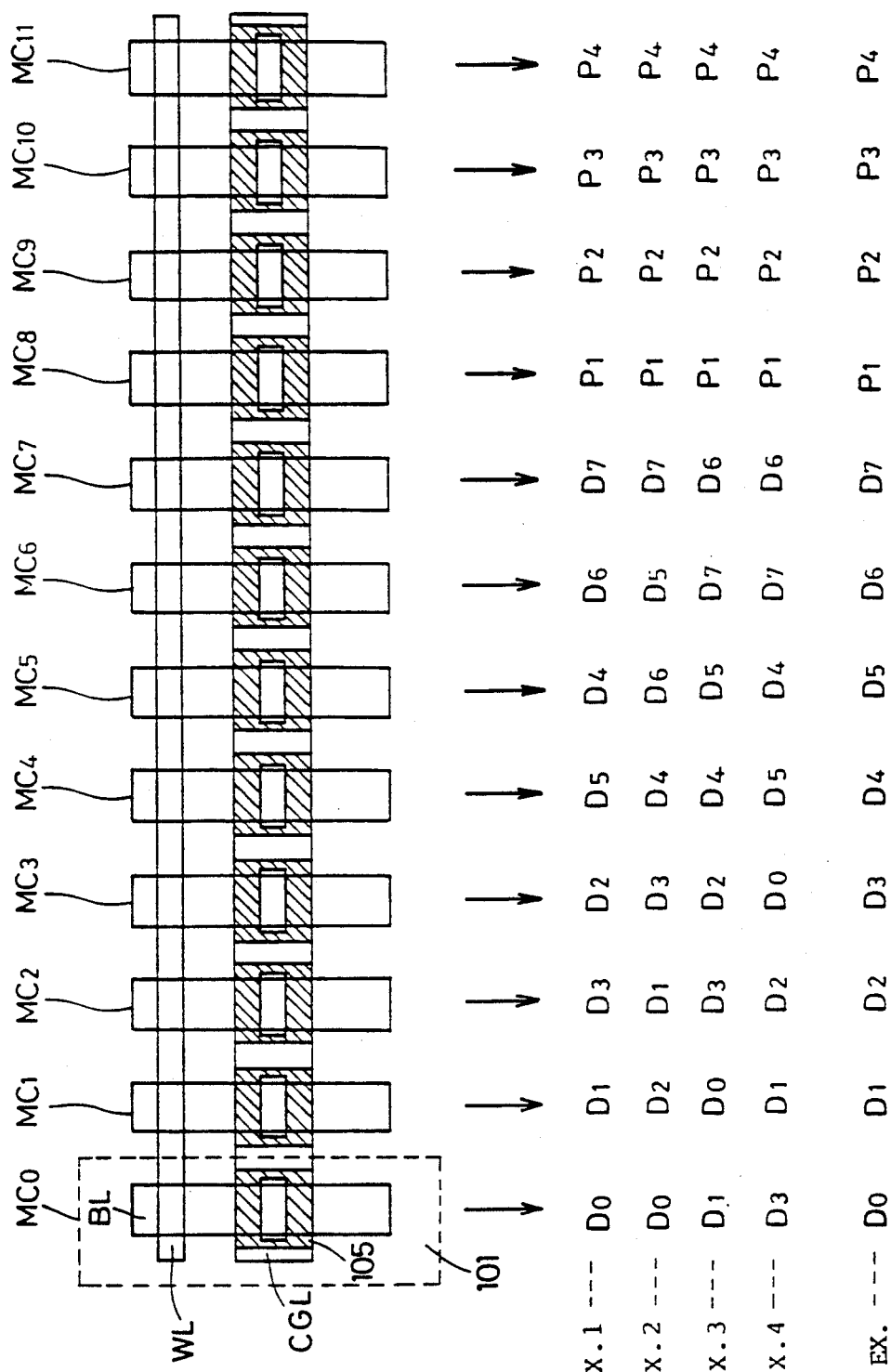
FIG. 2 is a plan view of correspondence between adjacent memory cells provided on a semiconductor substrate and data.

Referring to FIG. 2, memory cells MC0–MC11, which are provided in the memory array 1 shown in FIG. 1, are provided adjacent each other on a semiconductor substrate. The embodiment shown in FIG. 1 is represented as "Example 1" in FIG. 2. That is, correspondence between the memory cells MC0–MC11 and the data D0–D7 and P1–P4 is exhibited precisely. In addition, FIG. 2 shows the conventional interconnection shown in FIG. 8 for reference.

Moreover, FIG. 2 shows another correspondence between the memory cells MC0–MC11 and the data D0–D7 and P1–P4 as "Example 2", "Example 3" or "Example 4" according to another embodiment of the present invention.

Figure 3:
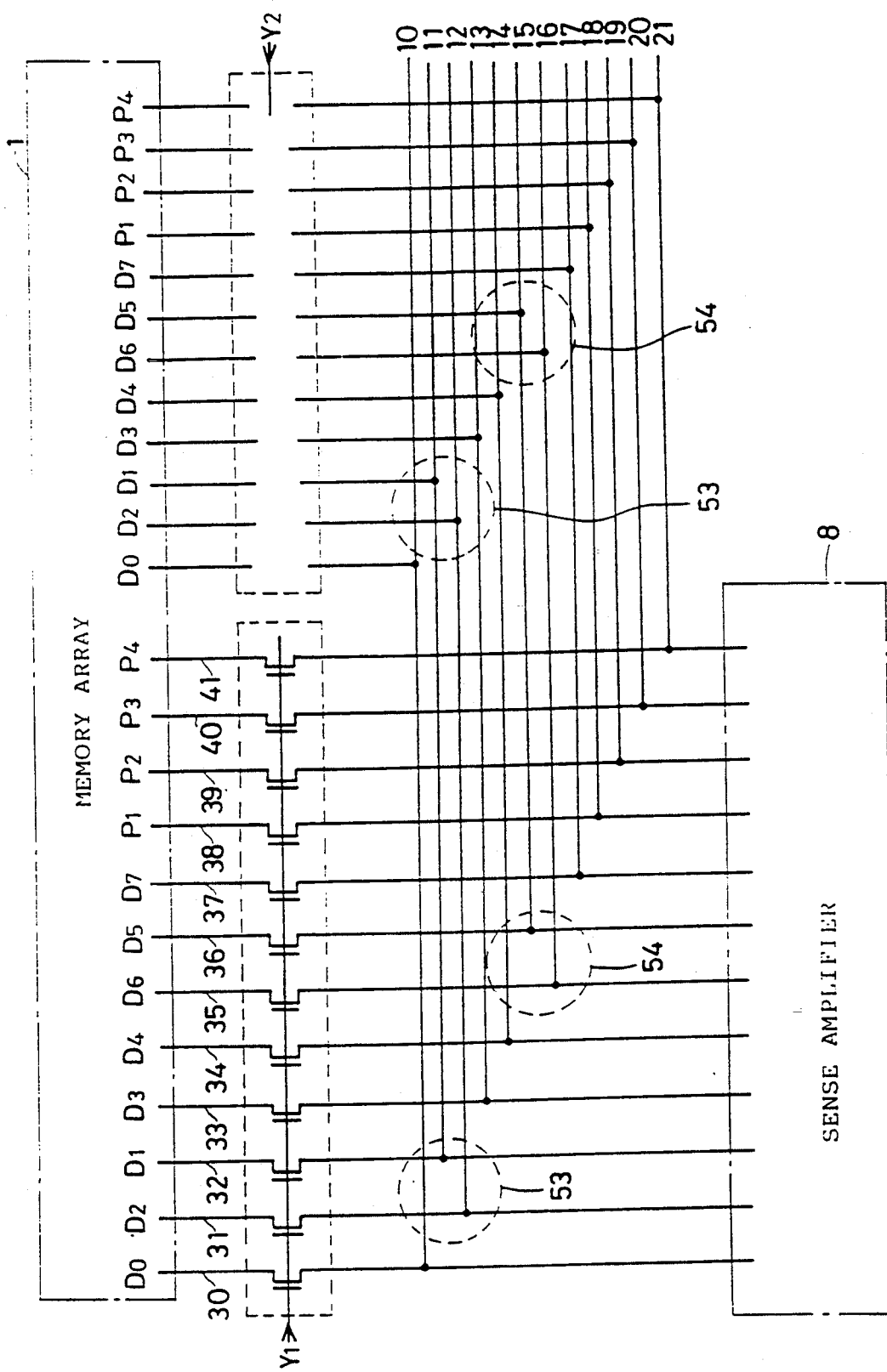
FIG. 3 is a circuit diagram of connection between bit lines and data lines according to another embodiment of the present invention.
Figure 4A:
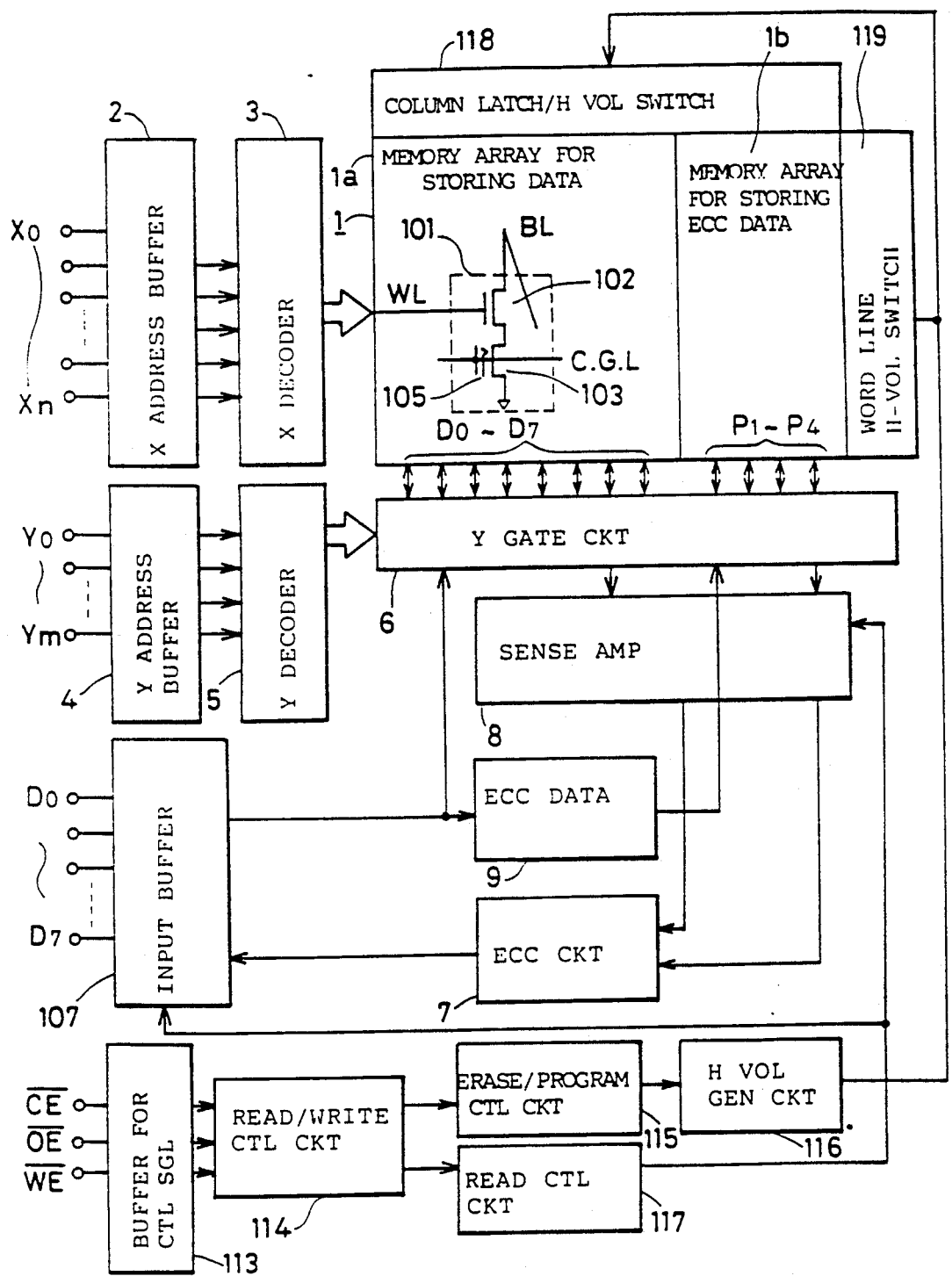
FIG. 4A is a circuit block diagram of a conventional EEPROM.
Figure 4B:
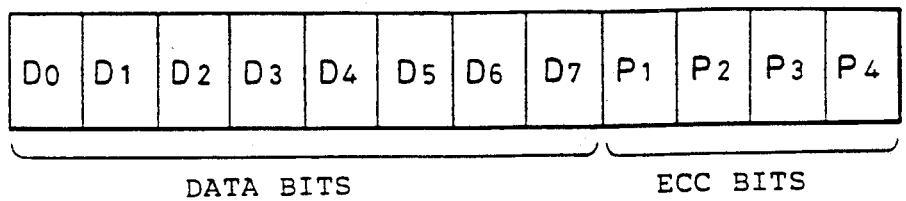
FIG. 4B is a data configuration diagram showing the configuration of one-byte data.
Figure 5:
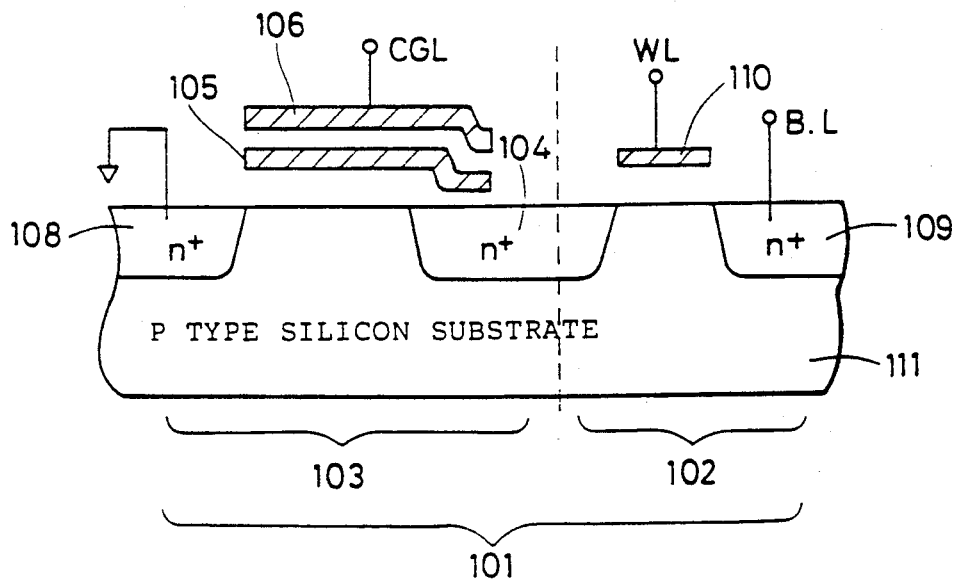
FIG. 5 is a cross sectional view of a memory cell for EEPROM.
Figure 9A:
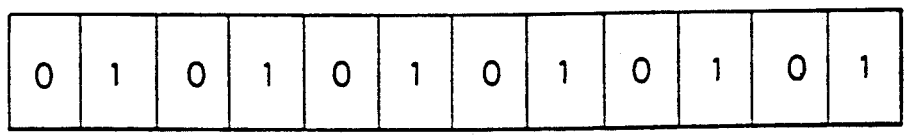
FIG. 9A is a bit pattern diagram of normal checker pattern data.
Figure 9B:
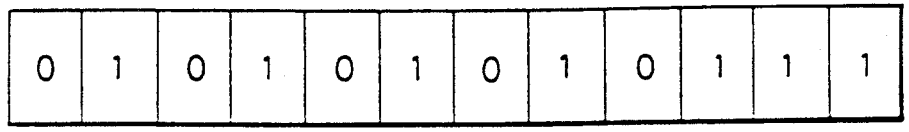
FIG. 9B is a bit pattern diagram of abnormal checker pattern data.

For example, the interconnection shown in FIG. 3 is employed to realize the correspondence shown in Example 2. Referring to FIG. 3, the bit lines 31 and 32 are respectively connected to the data lines 12 and 11 in connecting portions 53. Meanwhile, the bit lines 35 and 36 are respectively connected to the data lines 16 and 15 in the other connecting portions 54. In the case of employing the interconnection shown in FIG. 3, predetermined test data is supplied, which is exhibited in an equality as follows.

$$(D0, D1, ..., D7) = (0, 0, 1, 1, 0, 0, 1, 1) \tag{3}$$

Also in this case, since the ECC data shown by the equality (2) is generated, complete checker pattern data can be written in the adjacent memory cells MC0–MC11 shown in FIG. 2, as in the same manner as in the interconnection shown in FIG. 1.

Similarly, the following test data shown in the equality (4) is supplied in the case of Example 3 of FIG. 2.

$$(D0, D1, ..., D7) = (1, 0, 1, 0, 0, 1, 1, 0) \tag{4}$$

Furthermore, test data expressed in the following equality is supplied in the case of Example 4 shown in FIG. 2.

$$(D0, D1, ...D7) = (1, 1, 0, 0, 1, 0, 1, 0) \tag{5}$$

In the case of employing the test data expressed by the equality (4) or (5), an interconnection is required similar to those of FIGS. 1 and 3; however, a description thereof is not repeated because it is possible to infer the detailed example of this connection.

The description was given on modifications of the interconnection with respect to the memory cells MC0–MC7 for storing the data D0–D7 in the above example; however, the same effect as in the above example can be achieved even by modifications of the interconnection with respect to the memory cells MC8–MC11 for storing the ECC data P1–P4.

The description was given on the case of a data bit length of 8 bits and an ECC bit length of 4 bits in the above example; however, modifications of the interconnection similar to that of the above embodiment enables complete writing of the checker pattern data even in the other combinations shown in Table 1.

Such case was described that the present invention is applied to the EEPROM, in the above embodiment; however, needless to say, the invention has applicability also to an DRAM or an SRAM. That is, since it is necessary to detect in a test the presence of the interference between memory cells or the shorts between the signal lines in both the DRAM and SRAM, the complete writing of the checker pattern data is required. Therefore, the interconnections shown in FIGS. 1 to 3 become effective.

As has been described, with employment of the selective interconnections shown in FIGS. 1 and 3, for example, the data (0, 1, 0, ...0, 1) are written in the memory cells MC0–MC11 in FIG. 2 in one operation cycle. That is, since the checker pattern data, i.e., the signals having alternating voltage levels are stored in the adjacent memory cells MC0–MC11, the presence of undesired contact or interference between the memory cells can be detected by reading the stored data. In other words, since a connection altering circuit is provided to distribute test data and error correction data so that the alternating signal levels may be stored in the respective adjacent memory cells, one writing operation enables the complete checker pattern data to be written. Consequently, the undesired contact or interference between the memory cells and between the signal lines can easily be detected, resulting in a simplified checking procedure for the memory cells.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having an error correction function, comprising
    a first set of memory cells for storing data to be stored in consecutive memory cells;
    a second set of memory cells for storing error correction data in consecutive memory cells, said first and second sets of memory cells being consecutively provided on a semiconductor substrate in a predetermined direction;
    test data generating means for generating predetermined test data to be stored in said first set of memory cells;
    correction data generating means responsive to the predetermined test data for deriving correction data to be stored in the second set of memory cells; and
    connecting means for enabling the predetermined test data and the correction data to be stored, in a single writing cycle, in a checker pattern in the consecutive memory cells of the first and second sets of memory cells when no error is present in any of the memory cells.

2. The device of claim 1, wherein said semiconductor substrate comprises a single semiconductor substrate.

3. The semiconductor memory device of claim 1, wherein said connecting means includes
    first supplying means for connecting a predetermined number b of the predetermined test data and the correction data to the consecutive memory cells of the first and second sets of memory cells in a first order, and
    second connecting means for connecting a predetermined number c of the predetermined test data and the correction data to the consecutive memory cells of the first and second sets of memory cells in a second order, different from the first order, and where b and c are each $>0$.

4. The semiconductor memory device according to claim 3, wherein the test data generating means comprises:
    input buffer means connected to externally receive test data to provide m predetermined consecutive test data.

5. The semiconductor memory device according to claim 3, wherein
    said semiconductor memory device comprises an electrically erasable programmable read only memory.

6. The semiconductor memory device according to claim 5, wherein said semiconductor substrate comprises a single semiconductor substrate.

7. A semiconductor memory device having an error correction function, comprising
    a first set of memory cells for storing m data to be stored in m consecutive memory cells, $M_0...M_{m-1}$;
    a second set of memory cells for storing k correction data in k consecutive memory cells, $M_m...M_{m+k-1}$, where $2^k - 1 \geq m + k$ for single bit error correction, said first and second sets of memory cells being sequentially provided on a semiconductor substrate in a predetermined direction;
    test data generating means for providing m predetermined consecutive test data;
    correction data generating means responsive to the m predetermined consecutive test data for providing k consecutive error correction data consecutive with said m predetermined consecutive test data;
    first supplying means for connecting a predetermined number b of said m predetermined consecutive test data and said k consecutive error correction data to the consecutive memory cells, $M_0...M_{m+k-1}$, consecutively in a one to one correspondence; and
    second connecting means for supplying a predetermined number c of said m predetermined consecutive test data and said k consecutive error correction data to the consecutive memory cells, $M_0...M_{m+k-1}$, other than consecutively, in one to one correspondence, where b and c are each $>0$, and $b + c = m + k$, wherein
    said consecutive memory cells, $M_0...M_{m+k-1}$, store a checker test pattern in response to the m predetermined consecutive test data when no error is present in the memory cells.

8. The semiconductor memory device according to claim 7, further comprising:

m+k consecutive bit lines, $BL_0...BL_{M+k-1}$, consecutively connected to the m+k consecutive memory cells, $M_0...M_{m+k-1}$, and wherein said m predetermined consecutive test data are provided on m consecutive data lines, $DL_0...DL_{m-1}$, the m consecutive data lines, $DL_0...DL_{m-1}$, are connected to said correction data generating means by m consecutive error correcting lines $ECL_0...ECL_{m-1}$ and said k consecutive error correction data are provided by said correction data generating means on k consecutive data lines, $DL_m...DL_{m+k-1}$;

said first connecting means connects the predetermined number b of the m+k consecutive data lines, $DL_0...DL_{m+k-1}$ to the m+K bit lines, $BL_0...BL_{m+k-1}$, consecutively, in one to one correspondence.

9. The semiconductor memory device according to claim 7, wherein said second connecting means connects the predetermined number c of the m+k consecutive data lines, $DL_0...DL_{m+k-1}$ to the m+k bit lines, $BL_0...BL_{m+k-1}$, other than consecutively, in one to one correspondence.

10. The semiconductor memory device according to claim 7, wherein the correction data generating means comprises a plurality of coincidence detecting means for detecting coincidence in a plurality of predetermined combinations of the m predetermined consecutive test data provided by said input buffer means.

11. In a semiconductor memory device having an error correction function, including a first set of memory cells for storing m data to be stored in m consecutive memory cells, $M_0...M_{m-1}$;

a second set of memory cells for storing k correction data in consecutive memory cells, $M_m...M_{m+k-1}$, where $2^k-1 \geq m+k$ for single bit error correction, said first and second sets of memory cells being sequentially provided on a semiconductor substrate in a predetermined direction;

test data generating means for providing m predetermined test data on m consecutive data lines, $DL_0...DL_{m-1}$;

correction data generating means responsive to the m test data for providing k error correction data on k consecutive data lines, $DL_m...DL_{m+k-1}$; and connecting means for connecting the m+k consecutive data lines, $DL_0...DL_{m+k-1}$, to the consecutive memory cells, $M_0...M_{m+k-1}$, consecutively in a one to one correspondence; wherein said correction data generating means outputs the k error correction data in a pattern other than a checker pattern when m test data having a checker pattern is provided by said test data generating means, prohibiting a checker pattern from being stored in the m+k consecutive memory cells, $M_0...M_{m+k-1}$, when there is no error in the memory cells;

an improvement to enable a checker pattern to be stored in the m+k consecutive memory cells, $M_0...M_{m+k-1}$, in response to first m predetermined test data when there is no error in the memory cells, comprising first connecting means for connecting a predetermined number c of said consecutive data lines, $DL_0...DL_{m+k-1}$, to the m+k consecutive memory cells, $M_0...M_{m+k-1}$, other than consecutively in one to one correspondence, wherein c is $>0$ and $<m+k$, wherein the m+k consecutive memory cells, $M_0$ to $M_{m+k-1}$, store a checker test pattern in response to the first m predetermined test data when no error is present in the memory cells.

12. In a semiconductor memory device having an error correction function, comprising a first set of memory cells for storing m data to be stored in m consecutive memory cells, $M_0...M_{m-1}$;

a second set of memory cells for storing k correction data in k consecutive memory cells, $M_m...M_{m+k-1}$, where $2^k-1 \geq m+k$ for single bit error correction, said first and second sets of memory cells being sequentially provided on semiconductor substrate in a predetermined direction;

test data generating means for providing m predetermined test data on m consecutive data lines $DL_0...DL_{m-1}$;

correction data generating means responsive to the m test data for providing k error correction data on k consecutive data lines, $DL_m...DL_{m+k-1}$;

a method of testing the semiconductor memory device for errors, comprising the steps of:

generating first m predetermined test data;

providing k error correction data in response to the first m predetermined test data;

storing the m predetermined test data and the k error correction data in the m+k consecutive memory cells, $M_0...M_{m+k-1}$, of said first and second sets of memory cells; and reading out the data stored in the m+k consecutive memory cells, $M_0...M_{m+k-1}$, of said first and second sets of memory cells, wherein to store a checker pattern in the m+k consecutive memory cells, $M_0...M_{m+k-1}$, in response to the first m predetermined test data in a single writing cycle when there are no errors in the memory cells, the step of storing comprises:

connecting a predetermined number b of the m+k consecutive data lines, $DL_0...DL_{m+k-1}$, to the consecutive memory cells, $M_0...M_{m+k-1}$, consecutively in a one to one correspondence; and connecting a predetermined number c of the m+k consecutive data lines, $DL_0...DL_{m+k-1}$, to the consecutive memory cells, $M_0...M_{m+k-1}$, other than consecutively, in one to one correspondence, where b and c are each $>0$, and $b+c=m+k$.

* * * * *